US008027800B2

(12) United States Patent
Nachman et al.

(10) Patent No.: US 8,027,800 B2
(45) Date of Patent: Sep. 27, 2011

(54) APPARATUS AND METHOD FOR TESTING A PANEL OF INTERFEROMETRIC MODULATORS

(75) Inventors: Ramez Nachman, Santa Clara, CA (US); Lei Chen, Cupertino, CA (US); Tao Yu, Campbell, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 313 days.

(21) Appl. No.: 12/145,407

(22) Filed: Jun. 24, 2008

(65) Prior Publication Data

US 2009/0319218 A1    Dec. 24, 2009

(51) Int. Cl.
*G01R 31/00* (2006.01)

(52) U.S. Cl. .............. 702/117; 702/64; 702/81

(58) Field of Classification Search .............. 702/64, 702/66, 81, 117; 430/30, 31; 359/259; 345/94, 345/95; 342/156; 310/12.03
See application file for complete search history.

(56) References Cited

U.S. PATENT DOCUMENTS

| | | | |
|---|---|---|---|
| 5,559,358 A | | 9/1996 | Burns et al. |
| 5,684,501 A * | | 11/1997 | Knapp et al. ............ 345/94 |
| 6,040,937 A | | 3/2000 | Miles |
| 6,077,452 A | | 6/2000 | Litvak |
| 6,160,541 A | | 12/2000 | Palalau et al. |
| 6,275,326 B1 | | 8/2001 | Bhalla et al. |
| 6,285,207 B1 | | 9/2001 | Listwan |
| 6,509,620 B2 | | 1/2003 | Hartwell et al. |
| 6,526,829 B1 | | 3/2003 | Lysen et al. |
| 6,567,715 B1 | | 5/2003 | Sinclair et al. |
| 6,630,834 B2 | | 10/2003 | Min et al. |
| 6,657,218 B2 | | 12/2003 | Noda |
| 6,674,090 B1 | | 1/2004 | Chua et al. |
| 6,674,562 B1 * | | 1/2004 | Miles ............ 359/291 |
| 6,734,977 B2 | | 5/2004 | Noda |

(Continued)

FOREIGN PATENT DOCUMENTS

GB    2 217 839    11/1989

(Continued)

OTHER PUBLICATIONS

Pons-Nin et al., Jun. 2002, Voltage and pull-in time in current drive of electrostatic actuators, Journal of Microelectromechanical Systems, 11(3):196-205.

(Continued)

*Primary Examiner* — Mohamed Charioui
*Assistant Examiner* — Elias Desta
(74) *Attorney, Agent, or Firm* — Knobbe Martens Olson & Bear, LLP

(57) ABSTRACT

In some embodiments, each interferometric modulator has a stiction threshold voltage. If a voltage above the stiction threshold voltage is applied to the interferometric modulator, the interferometric modulator enters a stiction state permanently, i.e., becomes "stuck," and the interferometric modulator becomes inoperable. Disclosed are apparatuses, methods and computer-readable media for testing a panel of interferometric modulators. A ramped voltage waveform is applied to a plurality of interferometric modulators of the panel. In response to applying the ramped voltage, the stiction threshold voltage is identified. At or above this voltage, the number of stuck interferometric modulators in the panel reaches or exceeds a first threshold number, for example, 50% of the total number of the interferometric modulators constituting the panel. The embodiments can be used to establish stiction benchmark for panel manufacturing processes, to collect data for generating statistical distribution, etc.

32 Claims, 13 Drawing Sheets

U.S. PATENT DOCUMENTS

| | | | |
|---|---|---|---|
| 6,781,702 B2 | 8/2004 | Giannakopoulos et al. | |
| 6,950,193 B1 | 9/2005 | Discenzo | |
| 7,026,821 B2 | 4/2006 | Martin | |
| 7,075,700 B2 | 7/2006 | Muenter | |
| 7,123,216 B1 | 10/2006 | Miles | |
| 7,327,510 B2 | 2/2008 | Cummings et al. | |
| 7,339,384 B2 | 3/2008 | Peng et al. | |
| 7,355,936 B2 | 4/2008 | Senshu | |
| 7,412,775 B1 | 8/2008 | Karnick et al. | |
| 7,423,287 B1 | 9/2008 | U'Ren et al. | |
| 7,453,579 B2 | 11/2008 | Kothari et al. | |
| 7,550,810 B2 * | 6/2009 | Mignard et al. | 257/419 |
| 7,580,176 B2 | 8/2009 | Cummings et al. | |
| 7,586,602 B2 | 9/2009 | Maity et al. | |
| 7,723,015 B2 * | 5/2010 | Miles | 430/313 |
| 2003/0102858 A1 | 6/2003 | Jacobson et al. | |
| 2004/0042000 A1 | 3/2004 | Mehrl et al. | |
| 2004/0218341 A1 | 11/2004 | Martin et al. | |
| 2005/0030551 A1 | 2/2005 | Rosakis et al. | |
| 2005/0042777 A1 | 2/2005 | Boger et al. | |
| 2006/0044298 A1 | 3/2006 | Mignard et al. | |
| 2006/0103643 A1 | 5/2006 | Mathew et al. | |
| 2006/0114243 A1 | 6/2006 | Iwasaki | |
| 2006/0243023 A1 | 11/2006 | Wong | |
| 2007/0075942 A1 | 4/2007 | Martin et al. | |
| 2007/0201038 A1 | 8/2007 | Cummings et al. | |
| 2009/0051369 A1 | 2/2009 | Kogut et al. | |
| 2009/0201008 A1 | 8/2009 | Chou et al. | |
| 2009/0201009 A1 | 8/2009 | Govil | |
| 2009/0201033 A1 | 8/2009 | Govil | |
| 2009/0201034 A1 | 8/2009 | Govil | |
| 2009/0204350 A1 | 8/2009 | Govil et al. | |
| 2009/0207159 A1 | 8/2009 | Govil | |
| 2009/0213107 A1 | 8/2009 | Govil | |
| 2009/0251157 A1 | 10/2009 | Govil | |
| 2010/0321761 A1 | 12/2010 | Cummings et al. | |

FOREIGN PATENT DOCUMENTS

| | | |
|---|---|---|
| WO | WO 02/093116 | 11/2002 |

OTHER PUBLICATIONS

Conner, "Hybrid Color Display Using Optical Interference Filter Array," SID Digest, pp. 577-580 (1993).

Guckel et al., "Fine-Grained Polysilicon Films with Built-In Tensile Strain," IEEE Transactions on Electron Devices, vol. 35, No. 6, pp. 801-802, (1988).

Jerman et al., "A Miniature Fabry-Perot Interferometer with a Corrugated Silicon Diaphragm Support," IEEE Electron Devices Society (1988).

Lin et al., "A Micro Strain Gauge with Mechanical Amplifier," J. of Microelectromechanical Systems, vol. 6, No. 4, (1997).

Miles, "MEMS-based interferometric modulator for display applications," Proc. SPIE vol. 3876, pp. 20-28, Sep. 1999.

Miles, "5.3: Digital Paper™: Reflective Displays Using Interferometric Modulation," SID 00 Digest, pp. 32-35 (2000).

Miles, 10.1: Digital PaperTM for Reflective Displays, SID 02 Digest, pp. 115-117 (2002).

Miles et al., "Digital Paper™ for Reflective Displays," J. of the Society for Information Display Soc. Inf. Display USA. vol. 11, No. 1, p. 209-215. (2003).

Raley et al., "A Fabry-Perot Microinterferometer for Visible Wavelengths," IEEE Solid-State Sensor and Actuator Workshop, Hilton Head, SC (1992).

Singh et al., "Strain Studies in LPCVD Polysilicon for Surface Micromachined Devices," Sensors and Actuators, vol. 77, pp. 133-138, (1999).

Srikar et al., "A Critical Review of Microscale Mechanical Testing Methods Used in the Design of Microelectromechanical Systems," Society for Experimental mechanics, vol. 43, No. 3, (2003).

van Drieenhuizen, et al., "Comparison of Techniques for measuring Both Compressive and Tensile Stress in Thin Films." Sensors and Actuators, vol. 37-38, pp. 759-765. (1993).

Zhang, et al., "Measurements of Residual Stresses in Thin Films Using Micro-Rotating-Structures." Thin Solid Films, vol. 335, pp. 97-105, (1998).

Castaner et al., May 1, 2000, Pull-in time-energy product of electrostatic actuators: comparison of experiments with simulation, Sensors and Actuators, 83(1-3):263-269.

Dumas et al., 2007, A novel approach for online sensor testing based on an encoded test stimulus, 12th IEEE European Test Symposium, pp. 105-110.

International Business Machines Corporation, Apr. 1, 2000, Half contact array testing method for TFT array, Research Disclosure, Mason Publications, Hampshire, GB, 423(167), abstract, 1 p.

ISR and WO dated Feb. 3, 2011 in PCT/US09/047847.

IPRP dated Feb. 24, 2011 in PCT/US09/047847.

* cited by examiner

|  | + $V_{bias}$ | - $V_{bias}$ |
|---|---|---|
| 0 | Stable | Stable |
| + ΔV | Relax | Actuate |
| − ΔV | Actuate | Relax |

Column Output Signals (columns), Row Output Signals (rows)

US 8,027,800 B2

APPARATUS AND METHOD FOR TESTING A PANEL OF INTERFEROMETRIC MODULATORS

BACKGROUND

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In certain embodiments, a method of testing a panel comprising a plurality of interferometric modulators comprises: applying a ramped voltage waveform to the plurality of interferometric modulators of the panel; and in response to applying the ramped voltage, identifying a first voltage at which a first threshold number of the plurality of interferometric modulators of the panel enter a stiction state, wherein with respect to an interferometric modulator that enters the stiction state, a first portion of the interferometric modulator adheres to a second portion of the interferometric modulator.

In certain embodiments, an apparatus for testing a panel comprising a plurality of interferometric modulators comprises: a voltage source configured to apply a ramped voltage waveform to the plurality of interferometric modulators of the panel; a detector configured to detect a number of the plurality of interferometric modulators of the panel are in a stiction state, wherein with respect to an interferometric modulator that is in the stiction state, a first portion of the interferometric modulator adheres to a second portion of the interferometric modulator; and a processor configured to receive signals from the voltage source and from the detector and identify a first voltage at which a first threshold number of the plurality of interferometric modulators enter the stiction state.

In certain embodiments, an apparatus for testing a panel comprising a plurality of interferometric modulators comprises: means for applying a ramped voltage waveform to the plurality of interferometric modulators of the panel; and means for, in response to applying the ramped voltage, identifying a first voltage at which a first threshold number of the plurality of interferometric modulators of the panel enter a stiction state, wherein with respect to an interferometric modulator that enters the stiction state, a first portion of the interferometric modulator adheres to a second portion of the interferometric modulator.

In certain embodiments, a computer-readable medium has instructions stored thereon. When executed by a computer, the stored instructions cause the computer to: apply a ramped voltage waveform to a plurality of interferometric modulators of a panel; and in response to applying the ramped voltage, identify a first voltage at which a first threshold number of the plurality of interferometric modulators of the panel enter a stiction state, wherein with respect to an interferometric modulator that enters the stiction state, a first portion of the interferometric modulator adheres to a second portion of the interferometric modulator.

DETAILED DESCRIPTION OF EMBODIMENTS

Figure 1:
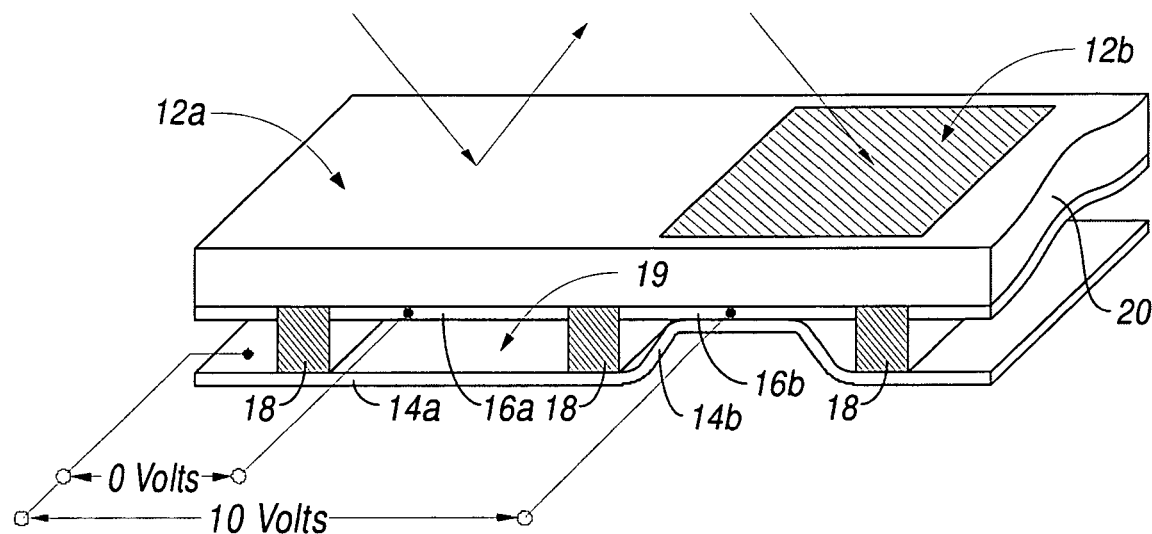
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

As used below with respect to FIGS. 8-12, an "interferometric modulator" refers to a single interferometric modulating pixel element (e.g. the interferometric modulator 12a in FIG. 1). An array of interferometric modulators (e.g. array 30 in FIG. 2) for use in a display is referred to as a "panel". A number of plates may be arranged for simultaneous manufacture on a single substrate, referred to as a "plate."

In some embodiments, each interferometric modulator has a stiction threshold voltage. If a voltage above the stiction threshold voltage is applied to the interferometric modulator in such embodiments, the interferometric modulator enters a stiction state permanently and the interferometric modulator becomes inoperable. Hereinafter, an interferometric modulator that enters the stiction state permanently is referred to as a "stuck interferometric modulator." Correspondingly, each panel comprising a plurality of interferometric modulators also has a stiction threshold voltage. If a voltage above the stiction threshold voltage is applied to the panel, the number of stuck interferometric modulators in the panel reaches or exceeds a first threshold number, for example, 50% of the total number of the interferometric modulators constituting the panel, which renders the panel less appropriate for its intended usage. By testing a panel and normalizing its stiction threshold voltage with respect to its actuation threshold voltage, or its voltage bias, the normalized parameter can be used to establish stiction benchmark for panel manufacturing processes, to collect data for generating statistical distribution of panel stiction performance, to differentiate stiction propensity of different process splits, and to establish process monitoring and process change control procedure for issues related to device stiction propensity.

One embodiment tests a panel of a plurality of interferometric modulators by applying a ramped voltage waveform to the panel and during the intervals between any two adjacent applications of the voltage determining the number of stuck interferometric modulators in the panel. The term "ramped" as used herein includes analog ramp, stepped ramp, increasing amplitude pulses, etc. The testing continues until the number of stuck interferometric modulators reaches or exceeds a first threshold number. The amplitude of the last applied voltage waveform is then identified as the stiction threshold voltage of the panel.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b (collectively referred to as interferometric modulators 12). In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
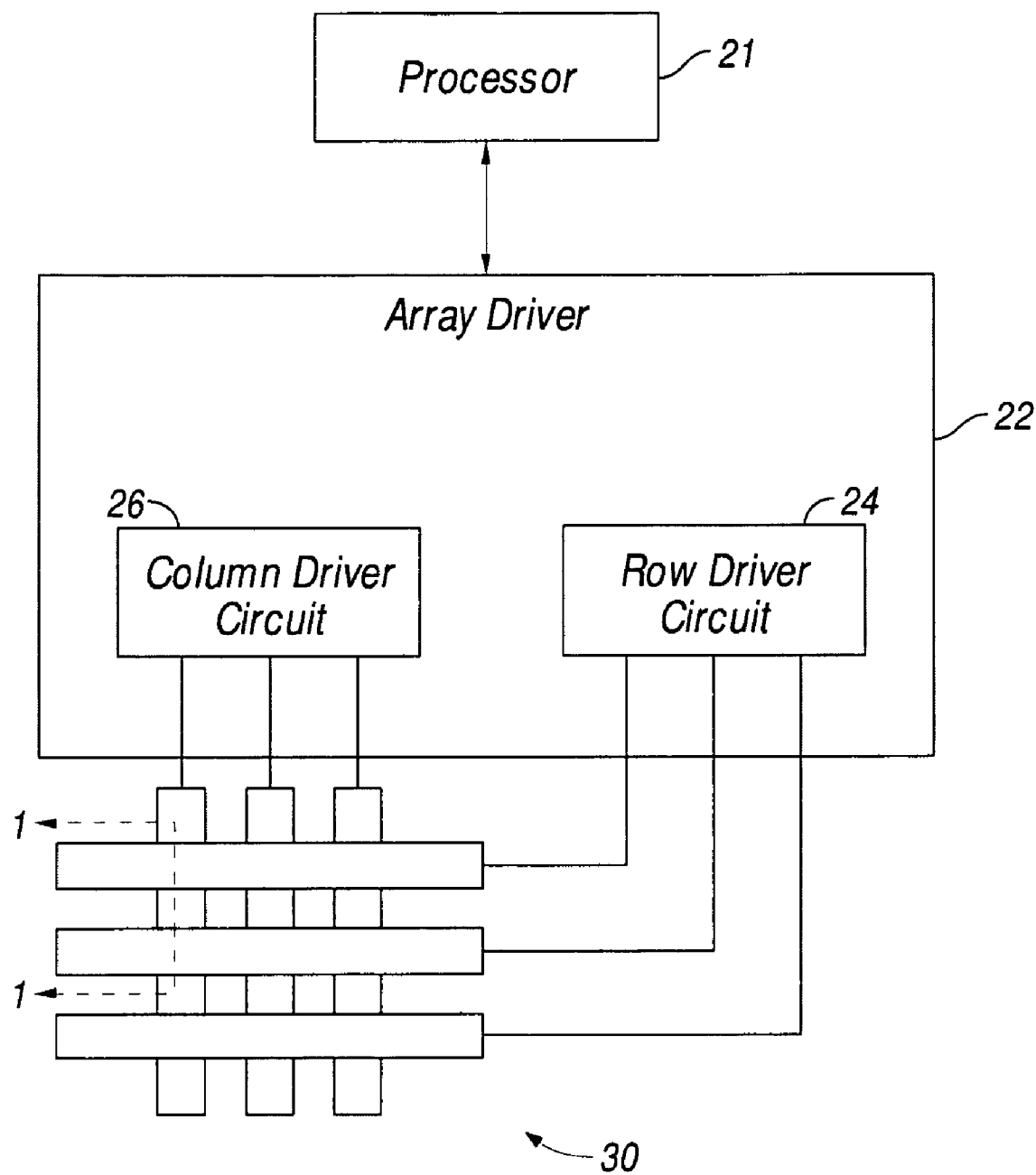
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with a set of actuated pixels in the first row. A row pulse is then applied to the row 1 electrode, actuating the pixels corresponding to the asserted column lines. The asserted set of column electrodes is then changed to correspond to a set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some number of frames per second. A wide variety of protocols for driving row and column electrodes of pixel arrays to produce display frames are also well known and may be used in conjunction with the present invention.

Figures 3, 4:
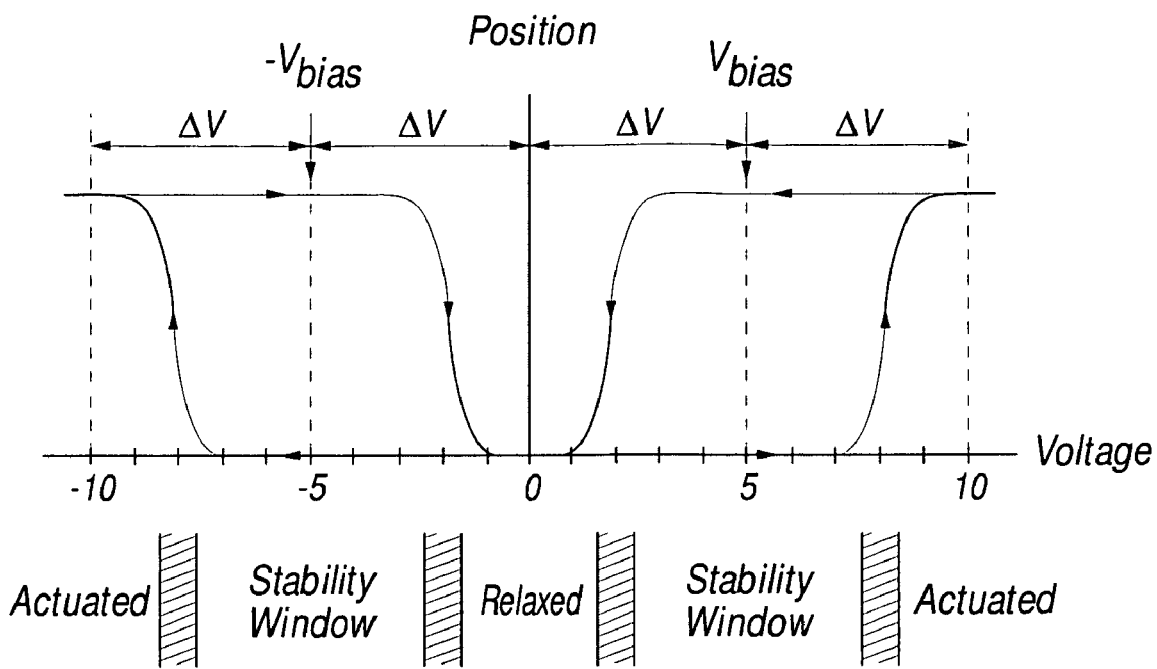
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
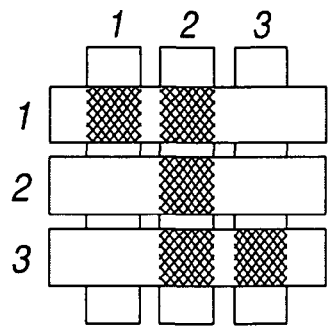
FIG. 5A illustrates one exemplary frame of display data in the 3×3 interferometric modulator display of FIG. 2.
Figure 5B:
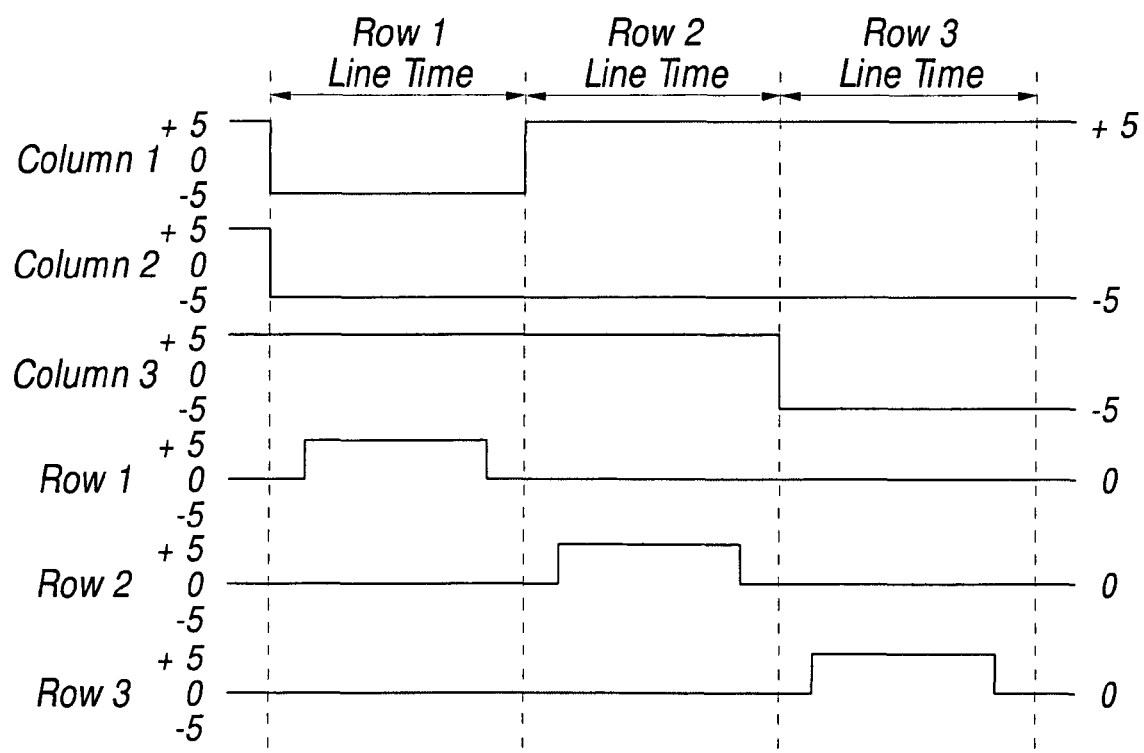
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which equals to voltage bias $V_{bias}$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
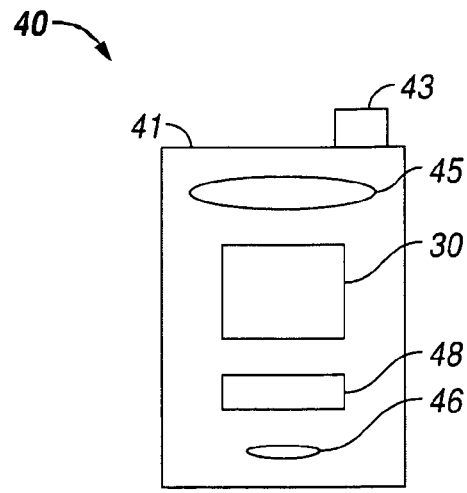
FIGS. 6A and 6B are system block diagrams illustrating an embodiment of a visual display device comprising a plurality of interferometric modulators.
Figure 6B:
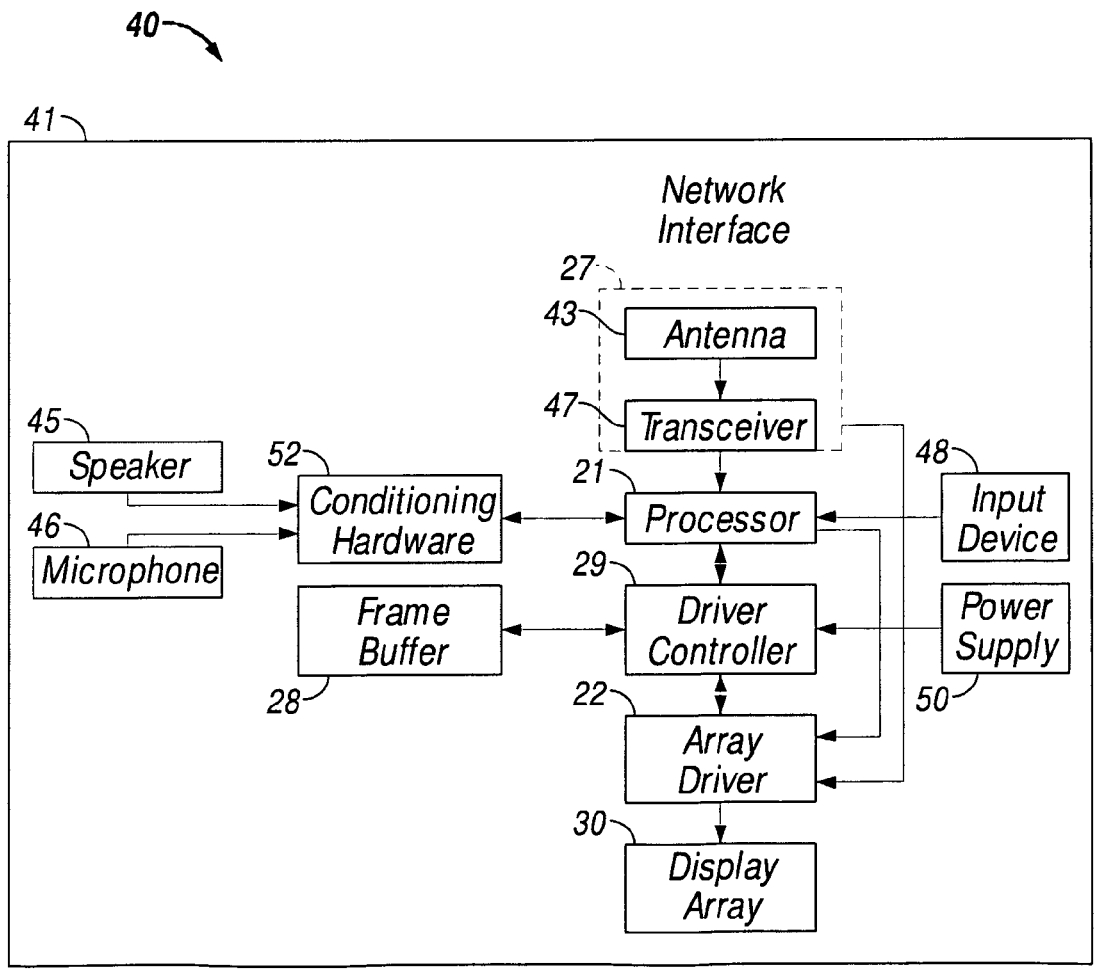

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
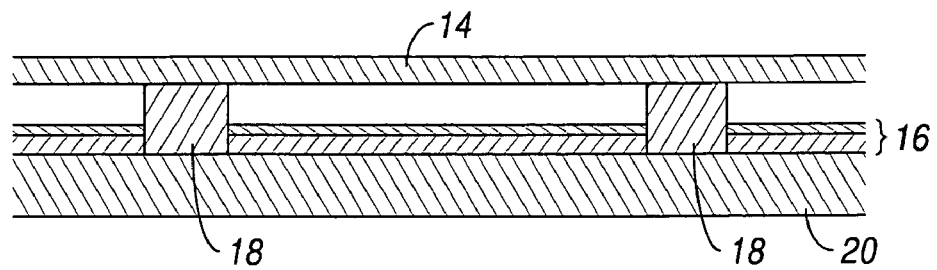
FIG. 7A is a cross section of the device of FIG. 1.
Figure 7B:
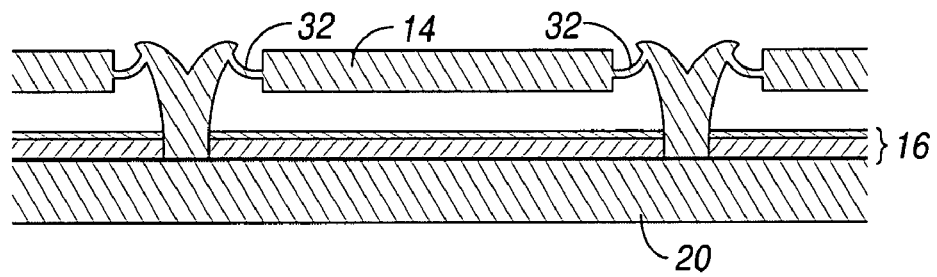
FIG. 7B is a cross section of an alternative embodiment of an interferometric modulator.
Figure 7C:
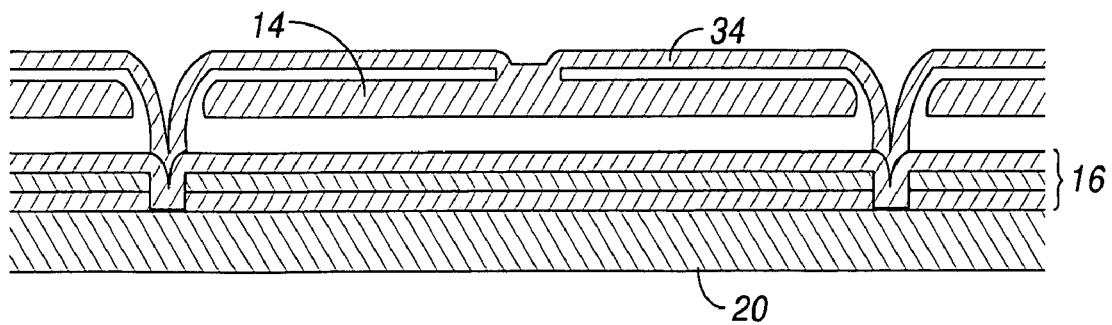
FIG. 7C is a cross section of another alternative embodiment of an interferometric modulator.
Figure 7D:
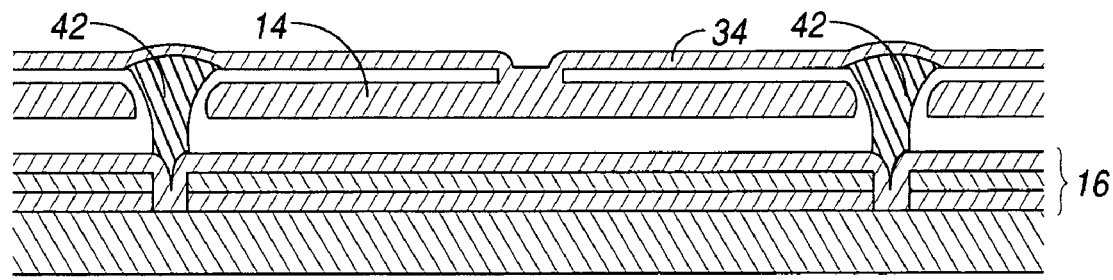
FIG. 7D is a cross section of yet another alternative embodiment of an interferometric modulator.
Figure 7E:
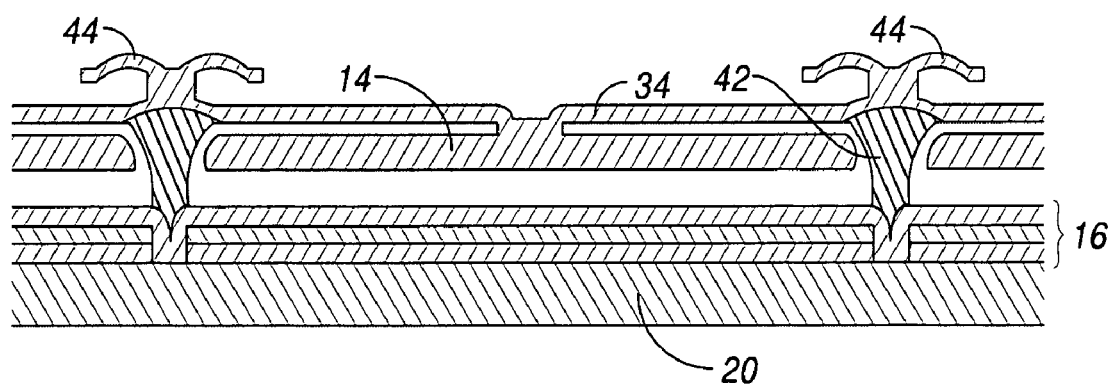
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based upon the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

In some embodiments, each interferometric modulator has a stiction threshold voltage. If a voltage above the stiction threshold voltage is applied to the interferometric modulator in such embodiments, the interferometric modulator enters a stiction state permanently and the interferometric modulator becomes inoperable. Hereinafter, an interferometric modulator that enters the stiction state permanently is referred to as a "stuck interferometric modulator." Correspondingly, each panel comprising a plurality of interferometric modulators also has a stiction threshold voltage. If a voltage above the stiction threshold voltage is applied to the panel, the number of stuck interferometric modulators in the panel reaches or exceeds a first threshold number, for example, 50% of the total number of the interferometric modulators constituting the panel, which renders the panel less appropriate for its intended usage. By testing a panel and normalizing its stiction threshold voltage with respect to its actuation threshold voltage, or its voltage bias $V_{bias}$, the normalized parameter can be used to establish stiction benchmark for panel manufacturing processes, to collect data for generating statistical distribution of panel stiction performance, to differentiate stiction propensity of different process splits, and to establish process monitoring and process change control procedure for issues related to device stiction propensity.

One embodiment tests a panel of a plurality of interferometric modulators by applying a ramped voltage waveform to the panel and during the intervals between any two adjacent applications of the voltage determining the number of stuck interferometric modulators in the panel. The testing continues until the number of stuck interferometric modulators reaches or exceeds a first threshold number. The amplitude of the last applied voltage waveform is then identified as the stiction threshold voltage of the panel.

Figure 8:
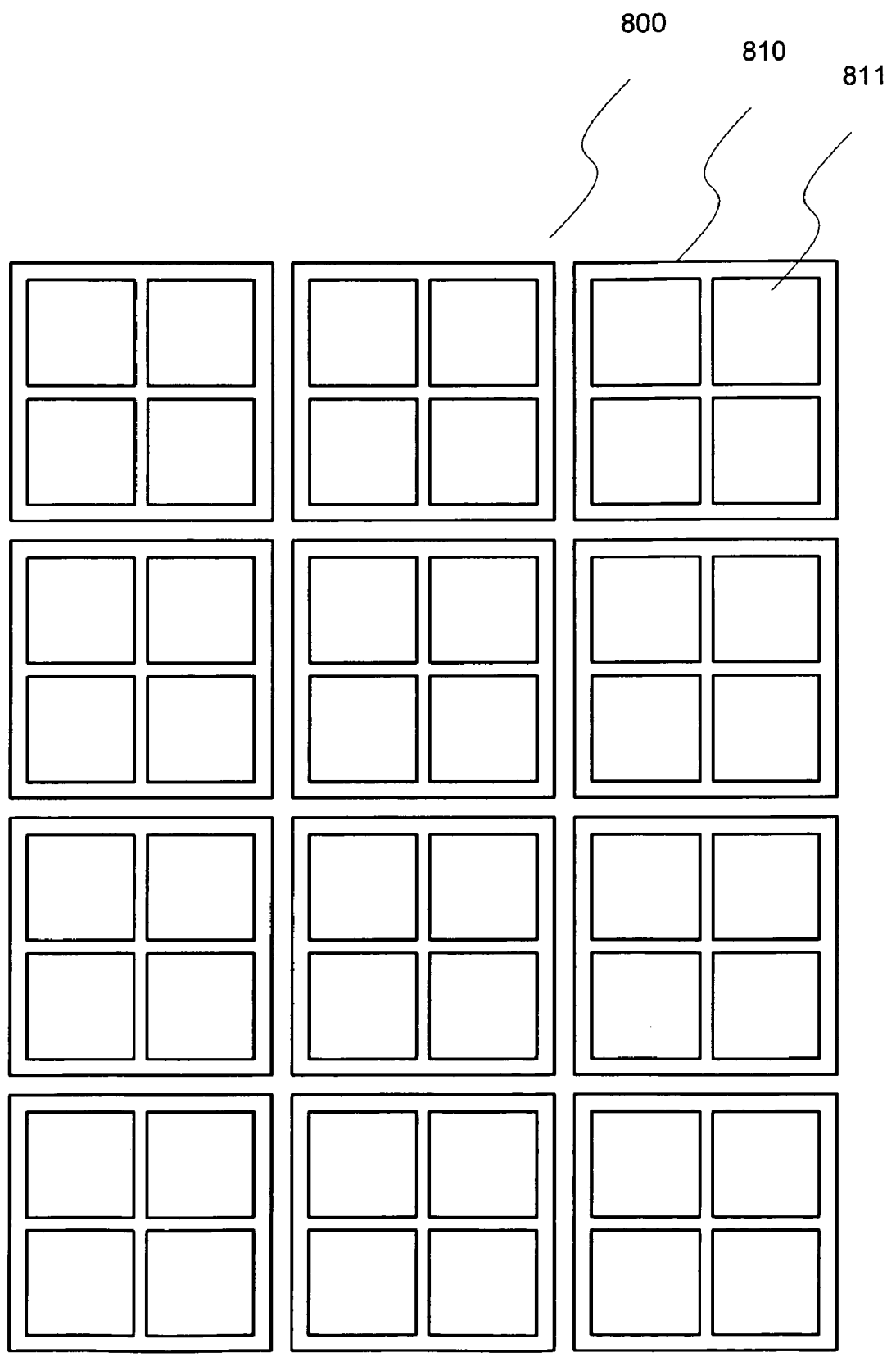
FIG. 8 is a schematic graphically illustrating a layout of a plate comprising a plurality of interferometric modulators.

FIG. 8 is a schematic graphically illustrating a layout of a plate comprising a plurality of interferometric modulators in one embodiment. The example as illustrated in FIG. 8 shows the plate 800 includes forty-eight (48) interferometric modulator panels 810, but a plate may include hundreds or thousands of interferometric modulators panels 810 depending upon different usages of the plate and various processes employed in the manufacturing of the plate.

Figure 9A:
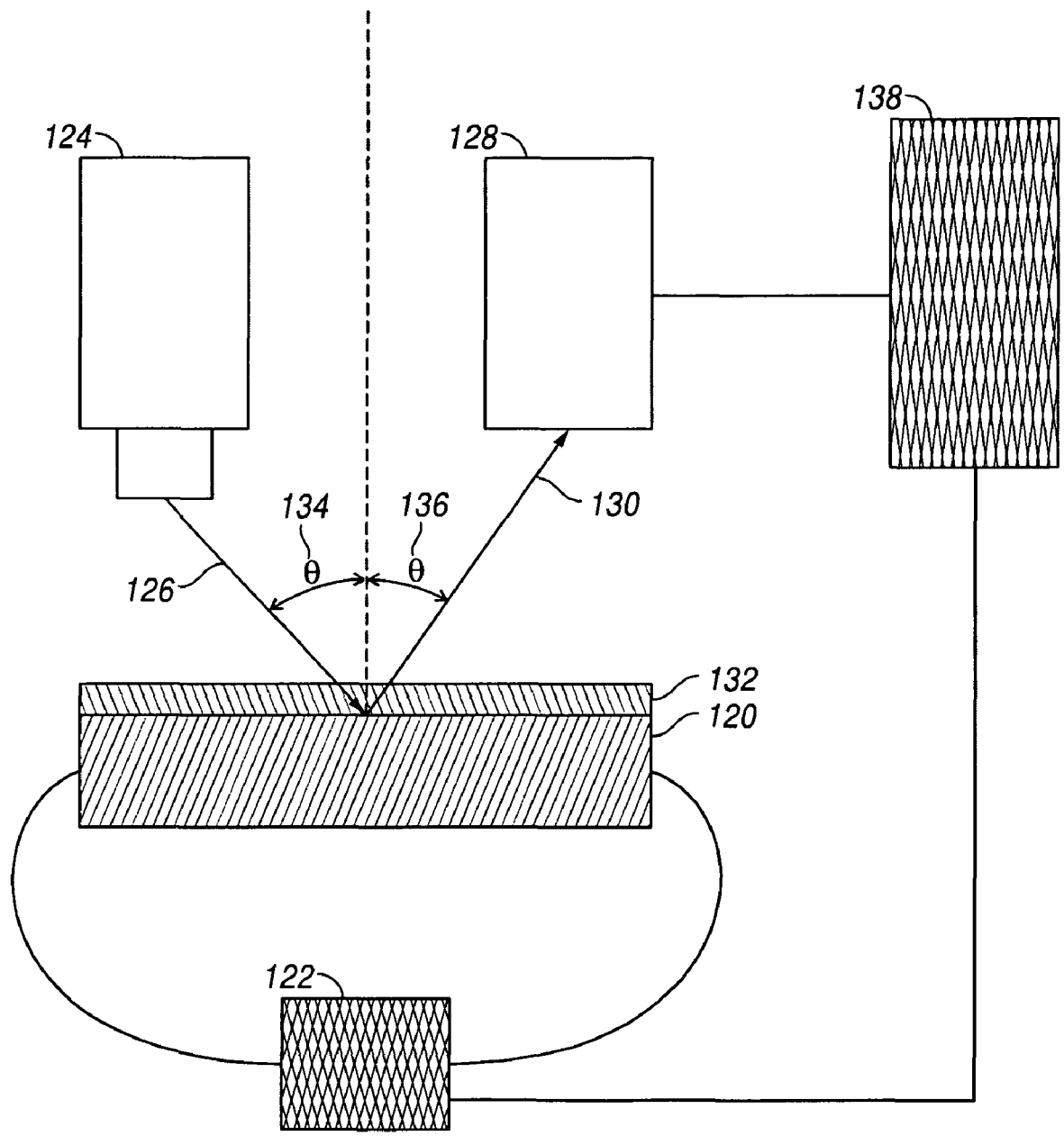
FIG. 9A and 9B are schematics illustrating systems for automatically determining reflectance of interferometric modulators.

FIG. 9A is a schematic illustrating a system for automatically determining reflectance of interferometric modulators. As illustrated in FIG. 9A, a panel 120 comprising a plurality of interferometric modulators is electrically connected to a voltage driving source 122. The interferometric modulators, for example, are similar to the interferometric modulator illustrated in FIGS. 1, 7A, 7B, 7C, 7D or 7E. The voltage driving source 122 applies the time-varying voltage stimulus, such as a square voltage waveform, to the panel 120. The voltage signal may be applied to all interferometric modulators in the panel 120 simultaneously. Alternatively, a voltage signal may be applied to only those interferometric modulators from which reflectivity are being measured. A light source 124 illuminates the panel 120. In one embodiment, a standard D65 light source is used for the light source 124. Light source 124 provides light 126 to the interferometric modulator panel 120, which is then reflected upward.

A photo detector 128 may be used to detect the intensity of the reflected light 130 from the interferometric modulator panel 120. A diffuser film 132 may be optionally placed over the interferometric modulator panel 120. The diffuser film 132 scatters the light 130 reflected from the interferometric modulator panel 120. Such scattering allows the light source 124 and detector 128 to be placed at angles 134 and 136 relative to the panel 120. While the incident light reflected from the panel 120 may be at a maximum if angles 134 and 136 are complementary, the use of a diffuser film 132 allows for detection at an angle differing from the angle of greatest specular reflection. If a diffuser film 132 is not used, then it can be advantageous that incident light 126 fall incident on and reflect back from the panel 120 at an angle close to perpendicular to the panel 120. Such a configuration may be used because interferometric modulators in some embodiments can have a narrow viewing angle causing the intensity of reflected light to fall rapidly at wider angles.

A computer 138 in communication with the detector 128 can be used to record reflectivity versus voltage characteristics (e.g., the hysteresis curve) and calculate electrical parameters. The computer 138 can be connected to the voltage driving source 122 to compute interferometric modulator response time information relative to the time when the driving voltage is applied to the panel 120. In typical applications for testing response times for multiple interferometric modulators, for example, a panel of interferometric modulators, the measured response time reflects the slowest response of the variables that affect response time.

In one or more exemplary embodiments, the functions described as being performed by the computer 138 may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Because a MEMS interferometric modulator display is reflective and specular, it can be advantageous to detect a measure of reflectance of the panel of incident light and reflected light that are both normal to the substrate surface (e.g., in-line lighting). In one embodiment, in-line lighting is accomplished using a system illustrated in FIG. 9B. In this system, a beam splitter 150 is provided that reflects light from a light source 152 onto the panel 120 being evaluated. The path of the light 126 from the beam splitter 150 is normal to the panel 120. The voltage driving source 122 applies a time-varying voltage stimulus to the panel 120 while the light source 152 illuminates the panel 120.

A detection module 128 is positioned to detect light 130 reflected from the panel 120 and passing through the beamsplitter 150. In this way, both the incident light 126 and the reflected light 130 are normal to the panel 120. In some embodiments, the system may additionally comprise a microscope objective 154 for evaluating only a small portion of the total active surface area. The panel 120 may be placed in probe mount 156 which may then be secured to an X-Y stage 158 for moving the panel 120 so that a portion of the active area is under the microscope objective 154 for evaluation. The detection module 128 may comprise one or more detectors such as a photo detector or spectrometer, and a CCD camera 160.

One or more beam splitters 162 may be used for simultaneous measurement by more than one detector. The light source 152 may be chosen to provide light having the appropriate spectral and intensity characteristics. For example, the light source 152 may approximate the characteristics of the light source that will typically be used to view a display the panel 120 is intended to be incorporated in. In one embodiment, a standard D65 light source is used. In some embodiments, the light source 152 may be coupled to an illumination control device 164, such as the Koehler design. The aperture of the illumination control device 164 may be adjusted to illuminate only the area of interest on the panel 120.

A computer 138 in communication with the detector 128 can be used to record reflectivity versus voltage characteristics (e.g., the hysteresis curve) and calculate parameters including response times of the interferometric modulators. The computer 138 can be connected to the voltage driving source 122 to compute interferometric modulator response time information relative to the time when the driving voltage is applied to the panel 120. In some embodiments, the computer 138 can also be used to control the driving voltage source 122 during testing of interferometric modulators.

Other embodiments of systems are available for achieving in-line lighting and detection. For example, in some embodiments a bundle of fiber optics, some of which provide incident light and others which detect reflected light may be aligned over an area of panel 120. One or more fibers in the bundle may be connected to a light source while one or more other fibers in the bundle are connected to detectors. In one embodiment, multiple outer fibers in the bundle are connected to a light source while one or more inner fibers in the bundle are connected to one or more detectors such as a spectrometer and/or a photo detector. In some embodiments, the end of the fiber bundle is positioned such that a beam splitter, such as beam splitter 150 in FIG. 9B, directs incident and reflected light normal to the panel 120. This configuration allows additional detectors in detection module 128, such as a CCD camera 160, to be used simultaneously. Alternatively, the fiber bundle may be positioned so that the bundle is normal to the panel 120.

Figure 9B:
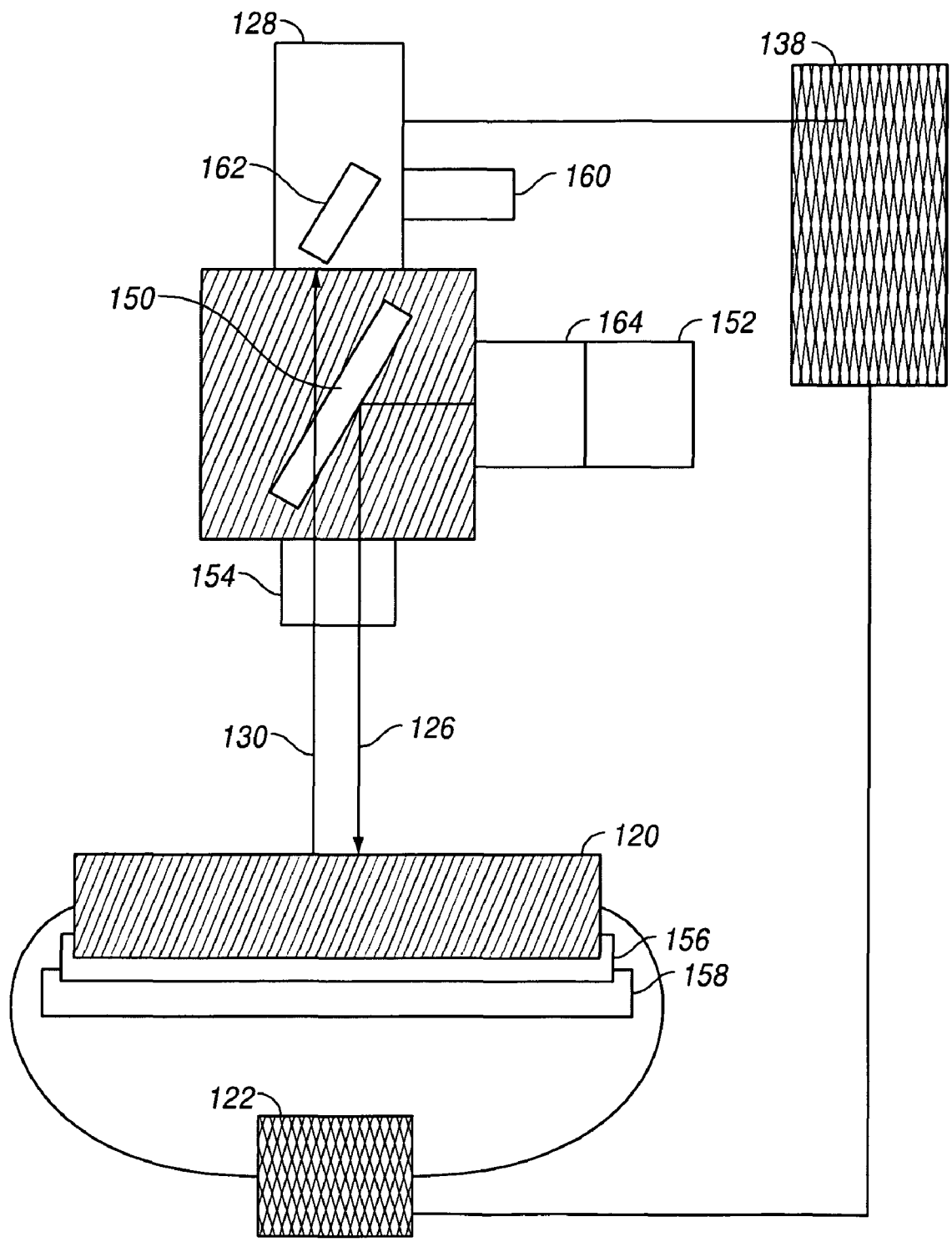

In order to test the panel 120, the voltage driving source 122 in FIGS. 9A and 9B applies a ramped voltage waveform to the panel 120. During the interval between any two adjacent pulses, the applied voltage is reduced, for example, to the offset voltage of the panel 120. The computer 138 then detects or calculates the number of stuck interferometric modulators in the panel 120, as described in next paragraph of this specification. If the computer 138 determines that the number of stuck interferometric modulators does not reach or exceed a first threshold number, for example, 50% of the total number of the interferometric modulators constituting the panel 120, the computer 138 instructs the voltage driving source 122 to apply the voltage waveform with an increased (i.e., ramped) amplitude to the panel 120. In one embodiment, the increased (i.e., ramped) amplitude is a half (0.5) volt per increment. After the voltage waveform with the increased amplitude has been applied for certain period of time, the voltage is reduced again, for example, to the offset voltage of the panel 120. In one embodiment, the certain period of time is one (1) second. The computer 138 again detects or calculates the number of stuck interferometric modulators. The number of stuck interferometric modulators in the panel 120 generally increases as the amplitude of ramped voltage waveform applied to the panel 120 increases, in some embodiments. Once the number of stuck interferometric modulators reaches or exceeds the first threshold number, the computer 138 identifies the voltage of the voltage waveform previously applied before the voltage is reduced, for example, to the offset voltage of the panel 120, as the stiction threshold voltage of the panel 120.

In the above process, in order to detect or calculate the number of stuck interferometric modulators, various embodiments can be used. In each stuck interferometric modulator, a first portion of the interferometric modulator adheres to a second portion of the interferometric modulator. Such adhesion affects the optical and electrical characteristics of the interferometric modulator. In one embodiment, the computer 138 instructs the photo detector 128 as illustrated in FIG. 9A or the detection module 128 as illustrated in FIG. 9B to detect the intensity of the reflected light from each interferometric modulators of the panel 120 and identifies (e.g., counts) the number of the interferometric modulators from which the reflected light reaches or does not reach a predetermined intensity. In another embodiment, a digital camera and image processing code are utilized in identifying (e.g., counting) the number of stuck interferometric modulators. For example, each time the applied voltage is reduced to the offset voltage of the panel 120, an image of the panel 120 is taken by using the digital camera. Such image may be saved for subsequent analysis using the image processing code. Such image may also be analyzed by the image processing code in real time, i.e., "on the fly." An example of the image processing code comprises Matlab, which is a numerical computing environment and programming language, created by The MathWorks, and allows easy matrix manipulation, plotting of functions and data, implementation of algorithms, creation of user interfaces, and interfacing with programs in other languages. The code modules or algorithms in Matlab are written to: (1) identify dark (and optionally bright) portion of an image captured by a camera; (2) determine a percentage area of the dark portion (optionally, as compared to the bright portion); (3) compute a number of pixels in the dark (and optionally bright) portion; and (4) compare the number of dark pixels with a threshold (or optionally the number of bright pixels and thence to a threshold). In addition to Matlab, any other types of image processing software can also be used for this purpose. With the image processing code, the number of stuck interferometric modulators can be identified. In one design of interferometric modulators, a stuck interferometric modulator substantially does not reflect light while a non-stuck interferometric modulator does. In some embodiments, the photo detector 128 detects an overall reflectance of the panel 120 and the computer 138 determines the number of stuck interferometric modulators based on the overall reflectance. For example, if all interferometric modulators operating normally provide a reflectance of 100%, then the computer 138 can determine that a detected reflectance of 50% corresponds to 50% of the interferometric modulators being stuck in a non-reflective state. In still other embodiments, the photo detector 128 detects an overall reflectance of an area or portion of the panel 120 and the computer 138 determines the number of stuck interferometric modulators based on the overall reflectance from that area or portion of the panel 120, and then repeats the detection for other areas or portions of the panel 120. In some other embodiments, a digital camera is utilized to take an image for an area or portion of the panels 120 and image processing code is utilized to identify (e.g., count) stuck interferometric modulators in such area or portion. Similar processes are conducted for other area or portion of the panel 120.

In another embodiment, the computer 138 instructs the voltage driving source 122 to apply a voltage to the panel 120, for example, after the applied voltage is reduced to the offset voltage of the panel 120, or in the absence of the application of the voltage waveform to the panel 120. Then, the computer 138 measures a capacitance of the panel 120. There are different embodiments for measuring the capacitance of the panel 120. In one embodiment, a fixed current is supplied to the panel 120 and then the voltages built up at the panel 120 are measured at certain intervals of time. If the voltage of the panel 120 moves up to a predetermined voltage level after a certain interval of time, the panel 120 is determined to have a high capacitance. Since an interferometric modulator has a high capacitance when it becomes stuck, the above embodiment can determine certain degrees of high capacitances of the panel 120, and the capacitance of the panel 120 can thus be measured. Based upon the measured capacitance of the panel 120, the computer 138 calculates the number of stuck interferometric modulators, because the adhesion in each stuck interferometric modulator affects the whole capacitance of the panel 120.

In one embodiment, the computer 138 screens the panel 120 based upon a stiction threshold voltage which is previously identified for the panel 120 and an actuation threshold voltage of the panel 120. In this embodiment, the actuation threshold voltage of the panel 120 refers to a threshold voltage at which substantially all interferometric modulators constituting the panel 120 are actuated. The threshold voltage of an interferometric modulator is illustrated in FIG. 3. As illustrated in FIG. 3, an interferometric modulator is in either the relaxed (or released) state or in the actuated state, depending on the magnitude of the potential difference applied to it. The changing of one state to another happens according to a hysteretic characteristic with a stability (or hold) window, where the device holds its current state when the applied potential difference falls within the hold window. Accordingly, as illustrated in FIG. 3, there are five input voltage difference ranges. Each of the five voltage difference ranges has a title reflecting its effect on the state of the interferometric modulator. Starting from the left of FIG. 3, the five voltage difference ranges are: 1) negative actuate ("Actuated"); 2) negative hold ("Stability Window"); 3) release ("Relaxed"); 4) positive hold ("Stability Window"); and 5) positive actuate ("Actuated"). The actuation threshold voltage of an interferometric modulator as illustrated in FIG. 3 is +8 volts and −8 volts. Because of variations in materials and processes for manufacturing interferometric modulators, different interferometric modulators may have different actuation threshold voltages, even if they constitute the same panel. In view of this, in one embodiment, the actuation threshold voltage of the panel 120 is set to be a voltage at which substantially all interferometric modulators constituting the panel 120 are actuated.

In one embodiment, the computer 138 normalizes the stiction threshold voltage with respect to the actuation threshold voltage or the voltage bias for each tested panel by calculating a ratio of the stiction threshold voltage to the actuation threshold voltage, or to the voltage bias $V_{bias}$, respectively. In one embodiment, if the ratio can be rounded to three (3) or above, the computer 138 characterizes the tested panel as "Operational" or "Capable" and therefore the tested panel passes the screening. If the ratio can be rounded to 2 or less, the computer 138 characterizes the tested panel as "Not Capable" and therefore the tested panel fails in the screening. Such a screening process may be beneficial for screening materials, e.g., panels. If a panel is not operational, it may be discarded. Such a process may be used to guarantee the functionality of the manufactured display panel for its intended working conditions.

In certain situations, the above screening process may be accelerated by omitting certain steps under certain conditions. In one embodiment, a passing threshold voltage is first identified for the panel 120. The passing threshold voltage refers to a voltage at which a second threshold number of interferometric modulators of the panel 120 do not enter the stiction state, which manifests that the functionality of the panel 120 is adequate for its intended usage. In this embodiment, the voltage driving source 122 as illustrated in FIGS. 9A and 9B also applies a ramped voltage waveform to the panel 120. However, after applying the ramped voltage waveform to the panel 120, the computer 138 determines whether the voltage applied to the panel 120 has reached or exceeded the passing threshold voltage as identified above. If the voltage applied to the panel 120 has reached or exceeded the passing threshold voltage for the panel 120, the computer 138 instructs the voltage driving source 122 to terminate the application of ramped voltage to the panel 120 and characterizes the panel 120 as operational. Because the passing threshold voltage is generally lower than the stiction threshold voltage, steps in relation to further application of higher voltages to the panel 120 are omitted. Accordingly, the whole screening process is comparatively accelerated.

Figure 10:
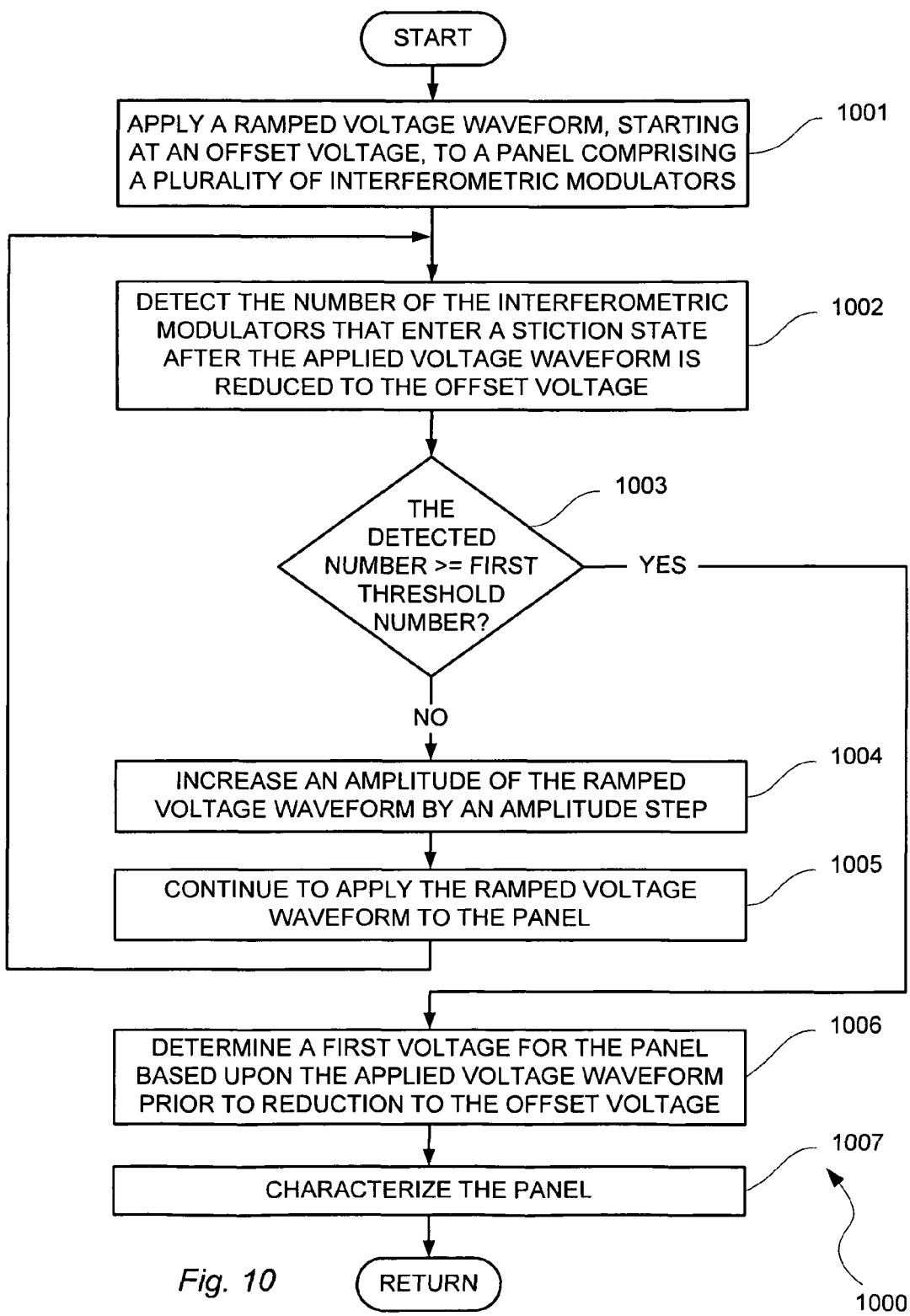
FIG. 10 is a flowchart illustrating a process for testing a panel of interferometric modulators.

FIG. 10 is a flowchart illustrating a process for testing a panel of interferometric modulators. As illustrated in FIG. 10, at a block 1001, the method 1000 applies a ramped voltage waveform to a panel comprising a plurality of interferometric modulators. The ramped voltage waveform starts at an offset voltage of the panel. The offset voltage of the panel may be the same as or different from the offset voltages of the interferometric modulators constituting the panel. FIG. 3 illustrates that the offset voltage of an interferometric modulator is zero (0) volt. However, because of variations in materials and processes for manufacturing interferometric modulators, different interferometric modulators may have different offset voltages, even if they constitute the same panel. In view of this, in one embodiment, the offset voltage of the panel 120 is set to be a voltage at which substantially all interferometric modulators constituting the panel 120 are stable in a relaxed position. That is, the offset voltage of the panel may be set at different voltage levels in various embodiments of drive schemes and/or interferometric modulators constituting the panel. Accordingly, the positive and negative bias voltages as illustrated in FIG. 3 (and later in FIG. 12A) and the positive and negative actuation threshold voltages are discussed relative to the offset voltage, and do not imply that the voltages are necessarily positive or negative relative to a ground voltage of zero.

At a block 1002, the method 1000 detects the number of the interferometric modulators that enter a stiction state, i.e., the stuck interferometric modulators, after the applied voltage of certain amplitude is reduced, for example, to the offset voltage. As described above with respect to FIGS. 9A and 9B, various embodiments can be used so that the computer 138 can detect or calculate the number of stuck interferometric modulators.

At a block 1003, the method 1000 decides whether the detected number of stuck interferometric modulators equals to or exceeds a first threshold number, for example, 50% of the total number of the interferometric modulators constituting the panel.

If the result of the block 1003 is "Yes," the method 1000 proceeds to a block 1006; otherwise, the method 1000 proceeds to a block 1004. At the block 1004, the method 1000 increases the amplitude of the ramped voltage waveform by an amplitude step. The amplitude step depends upon what voltage resolution is needed in an embodiment. In one embodiment, the amplitude step is a half (0.5) volt. Subsequent to the block 1004, the method 1000 proceeds to a block 1005 at which the method 1000 continues to apply the ramped voltage waveform to the panel, and later returns to the block 1002.

At the block 1006, the method 1000 determines a first voltage for the panel based upon the voltage waveform previously applied (e.g., in the blocks 1001 or 1005) immediately prior to its reduction, for example, to the offset voltage. At a block 1007, the method 1000 characterizes (or screens) the panel based upon the first voltage determined at the block 1006 and the actuation threshold voltage of the panel. The actuation threshold voltage of the panel has been described above with respect to FIGS. 9A and 9B be reference to FIG. 3.

The process of screening a panel may comprise further steps. In one embodiment, a first parameter is calculated for a first panel, for example, by dividing the first voltage of the first panel (as determined in the block 1006) by the actuation threshold voltage of the first panel or the voltage bias $V_{bias}$ of the first panel; then the first parameter of the first panel is compared with a second parameter of a second panel. The second parameter of the second panel is calculated similarly, for example, by dividing a first voltage of the second panel by the actuation threshold voltage of the second panel or the voltage bias $V_{bias}$ of the second panel. More embodiments of screening panels have been described above for example with respect to FIGS. 9A and 9B.

Figure 11:
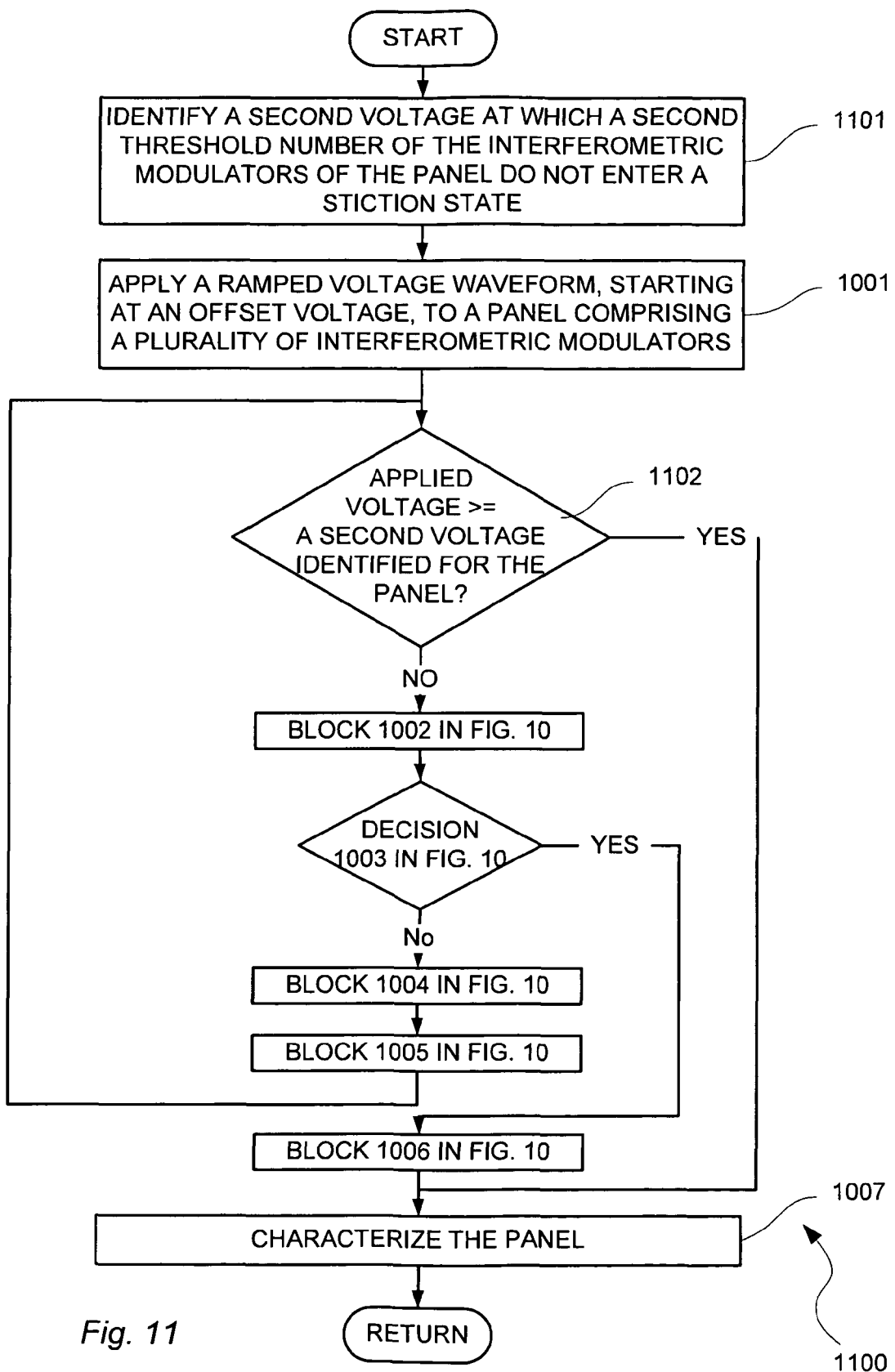
FIG. 11 is a variation to the process as illustrated in FIG. 10.

FIG. 11 illustrates a variation to the process as illustrated in FIG. 10. The method 1100 as illustrated in FIG. 11 differs from the method 1000 as illustrated in FIG. 10 mainly in the addition of blocks 1101 and 1102. At the block 1101, the method 1100 identifies a second voltage at which a second threshold number of the interferometric modulators of the panel do not enter a stiction state. The second voltage, for example, is the passing threshold voltage as described above for example with respect to FIG. 9A and 9B. Subsequent to the block 1101, the method 1100 proceeds to the block 1001, which has been described above with respect to FIG. 10. At a block 1102, which follows the block 1001, the method 1100 decides whether the applied voltage equals to or exceeds the second voltage as identified in the block 1101. If the result of the block 1102 is "Yes," the method 1100 proceeds to the block 1007, which has been described above with respect to FIG. 10; otherwise, the method 1100 proceeds to the block 1002, which has been described with respect to FIG. 10. As illustrated in FIG. 11, the blocks 1002 through 1006, which are included in FIG. 10, may be omitted under certain conditions. This accelerates the process as illustrated in FIG. 10.

Figure 12A:
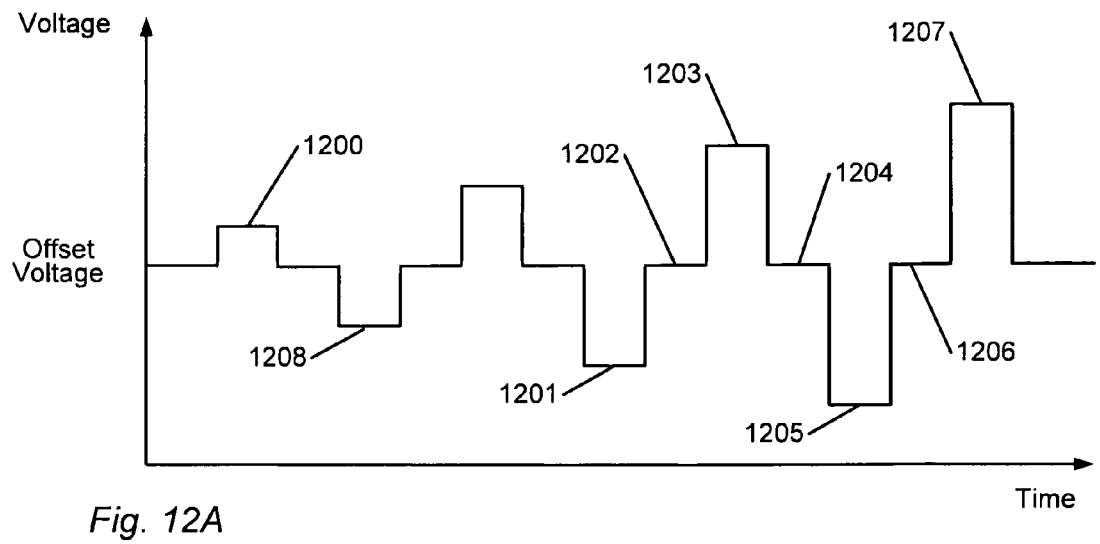
FIG. 12A is a schematic graphically illustrating a waveform used to test a panel of interferometric modulators.

FIG. 12A is a schematic graphically illustrating a waveform used to test a panel comprising a plurality of interferometric modulators. As illustrated in FIG. 12A, a voltage waveform, as a function of time, is applied to each interferometric modulator constituting the panel. In one embodiment, the voltage waveform comprises square wave pulses; the duration of each pulse is one (1) second for example; the frequency of the voltage waveform is one hundred (100) Hz for example. In one embodiment, the panel is the panel 120 as illustrated in FIG. 9A or 9B. In one embodiment, the voltage waveform starts at an offset voltage of the panel 120 and is charge-balanced about the offset voltage of the panel 120, as illustrated by waveform voltage amplitudes 1200, 1201, 1203, 1205 and 1207 in FIG. 12A. In this embodiment, the charge-balanced voltage waveform is ramped, as illustrated by the waveform voltage amplitude 1208, which is larger than the waveform voltage amplitude 1200. Waveform voltage amplitudes 1202, 1204 and 1206 illustrate that the applied voltage waveform may be reduced to the offset voltage level between ramped voltage levels. As stated above, the term "ramped" as used herein includes analog ramp, stepped ramp, increasing amplitude pulses, etc.

Figure 12B:
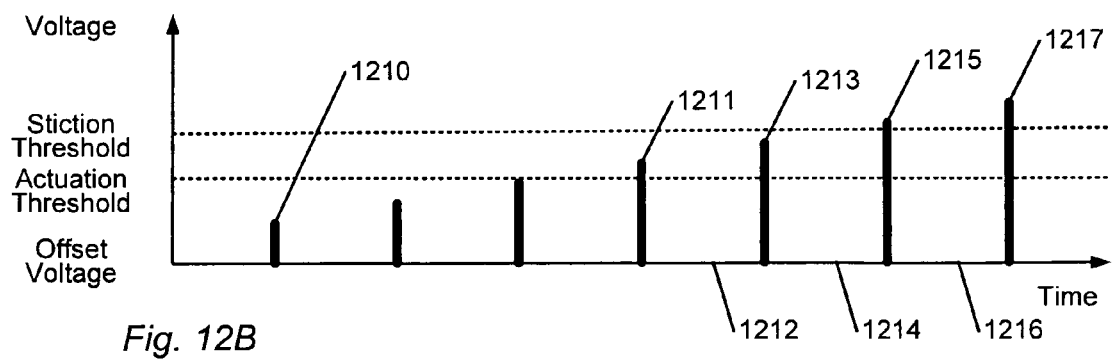
FIG. 12B is a schematic graphically illustrating the voltage levels of the waveform applied in FIG. 12A, integrated with respect to the offset voltage.

FIG. 12B is a schematic graphically illustrating the voltage amplitude levels of the waveform applied in FIG. 12A, integrated with respect to the offset voltage. The Y-axis of FIG. 12B illustrates the amplitude levels of the square waveform voltage pulses applied in FIG. 12A. The amplitude levels comprise three levels: offset voltage, actuation threshold voltage, and stiction threshold voltage, as illustrated in FIG. 12B. The X-axis of FIG. 12B illustrates the times at which square waveform voltage pulses are applied as illustrated in FIG. 12A. In the example as illustrated in FIGS. 12A and 12B, the voltage level of waveform voltage amplitude 1200 is at a voltage level 1210, which is above the offset voltage but below the actuation threshold voltage; the voltage level of waveform voltage amplitude 1201 is at a voltage level 1211, which is above the actuation threshold voltage but below the stiction threshold voltage; the voltage level of waveform voltage amplitude 1203 is at a voltage level 1213, which is also above the actuation threshold voltage but below the stiction threshold voltage; the voltage level of waveform voltage amplitude 1205 is at a voltage level 1215, which is above the stiction threshold voltage; and the voltage level of waveform voltage amplitude 1207 is at a voltage level 1217, which is also above the stiction threshold voltage.

Figure 12C:
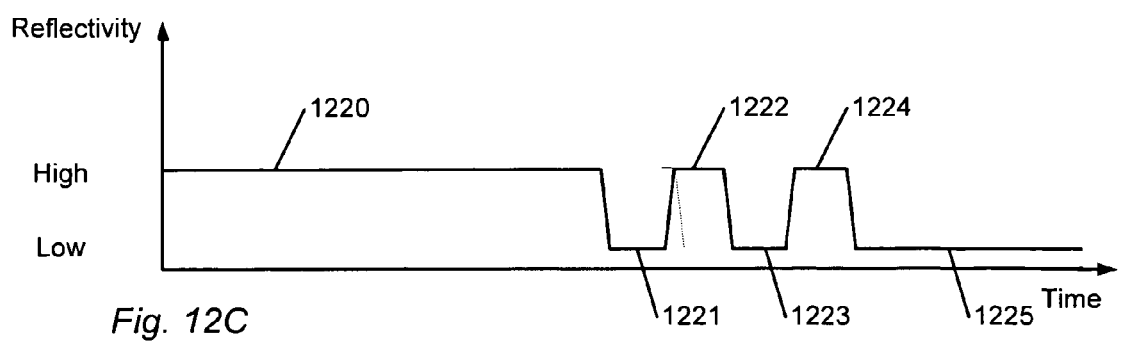
FIG. 12C is a schematic graphically illustrating an optical response of an interferometric modulator.

FIG. 12C is a schematic graphically illustrating an optical response of an interferometric modulator in some embodiments. As illustrated in FIG. 12C, voltage amplitudes 1220, 1222 and 1224 represent that the interferometric modulator is at a high reflectivity state where the interferometric modulator is not actuated; voltage amplitudes 1221, 1223 and 1225 represent that the interferometric modulator is at a low reflectivity state where the interferometric modulator is actuated or has become stuck. In another embodiment, the interferometric modulator is designed to exhibit a high reflectivity when it is actuated and a low reflectivity when it is not actuated.

As illustrated in FIGS. 12B and 12C, when a certain voltage, such as a voltage level 1210 is applied to the interferometric modulator, the interferometric modulator is not actuated, i.e., stays in the relaxed position, and its reflectivity remains high as illustrated by voltage amplitude 1220 is FIG. 12C. When certain voltages, such as voltage levels 1211 and 1213 are applied to the interferometric modulator, the interferometric modulator is actuated, and its reflectivity changes to low as illustrated by voltage amplitudes 1221 and 1223 in FIG. 12C. However, after the applied voltage levels are reduced, for example, to the offset voltage, such as voltage levels 1212 and 1214 in FIG. 12B, the interferometric modulator is de-actuated, i.e., returns to the relaxed position, and its reflectivity returns to high as illustrated by voltage amplitudes 1222 and 1224 in FIG. 12C. When a voltage, such as a voltage level 1215 is applied to the interferometric modulator, the interferometric modulator is actuated but becomes stuck. Although the applied voltage level is reduced, for example, to the offset voltage such as voltage level 1216, the reflectivity of the interferometric modulator remains low, as illustrated by voltage amplitude 1225 in FIG. 12C. Applying subsequent voltages, such as voltage level 1217, does not change the stiction state of the interferometric modulator, as illustrated by voltage amplitude 1225 in FIG. 12C. That is, the interferometric modulator has become permanently stuck.

As described above, in order to test a panel of interferometric modulators, embodiments of the present invention apply a ramped voltage waveform to the panel; and during the intervals between any two adjacent applications of the voltage, determine the number of stuck interferometric modulators in the panel. The testing continues until the number of stuck interferometric modulators reaches or exceeds a first threshold number. The amplitude of the last applied voltage waveform is then identified as the stiction threshold voltage of the panel. In order to accelerate the testing, the embodiments may also identify a passing threshold voltage of the panel before identifying a higher stiction threshold voltage. The stiction threshold voltage and/or the passing threshold voltage of the panel may be used to establish stiction benchmark for panel manufacturing processes, to collect data for generating statistical distribution of panel stiction performance, to differentiate stiction propensity of different process splits, and to establish process monitoring and process change control procedure for issues related to device stiction propensity.

A potential advantage of such a testing method is that multiple panels of interferometric modulators on a plate can be tested after manufacturing but before singulation and packaging of the singulated panels. By testing the plate and determining which panels of the plate exceed a stiction threshold, further processing can be reduced or eliminated on the failed panels, thus saving manufacturing resources. As well, manufacturing error analysis can be done on plates with an excessive number of failed panels, which might identify bad lots, process errors, and the like.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by the claims that follow.

What is claimed is:

1. A method of testing a panel comprising a plurality of interferometric modulators, the method comprising:
applying a ramped voltage waveform to the plurality of interferometric modulators of the panel; and
in response to applying the ramped voltage, identifying a first voltage of the ramped voltage waveform at which a first threshold number of the plurality of interferometric modulators of the panel enter a stiction state, wherein with respect to an interferometric modulator that enters the stiction state, a first portion of the interferometric modulator adheres to a second portion of the interferometric modulator.

2. The method of claim 1, wherein the identifying the first voltage comprises optically detecting a number of the interferometric modulators that enter the stiction state.

3. The method of claim 1, wherein the identifying the first voltage comprises calculating a number of the interferometric modulators that enter the stiction state by measuring a capacitance of the panel.

4. The method of claim 1, wherein the identifying the first voltage comprises identifying a number of the interferometric modulators that enter the stiction state by taking an image of the panel and analyzing the image.

5. The method of claim 1, additionally comprising comparing, in an electronic device, the identified first voltage and an actuation threshold voltage of the panel.

6. The method of claim 5, additionally comprising comparing a first parameter that is based at least in part upon the identified first voltage and one of the actuation threshold voltage and a voltage bias of the panel with a second parameter that is based at least in part upon an identified first voltage and one of an actuation threshold voltage and a voltage bias of another panel.

7. The method of claim 1, additionally comprising:
identifying a second voltage at which a second threshold number of the plurality of interferometric modulators of the panel do not enter the stiction state; and
terminating applying the voltage subsequent to the ramped voltage reaching the second voltage.

8. The method of claim 1, wherein the ramped voltage waveform is applied starting at an offset voltage of the panel.

9. The method of claim 8, wherein the ramped voltage waveform is charge-balanced.

10. The method of claim 9, wherein the ramped voltage waveform comprises a first portion at which the plurality of interferometric modulators of the panel are in a released state, a second portion at which the plurality of interferometric modulators of the panel are in an actuated state, and a third portion at which the predetermined proportion of the plurality of interferometric modulators of the panel are in a stiction state.

11. The method of claim 1, wherein the panel comprises one of a plurality of panels in a plate.

12. An apparatus for testing a panel comprising a plurality of interferometric modulators, comprising:
a voltage source configured to apply a ramped voltage waveform to the plurality of interferometric modulators of the panel;
a detector configured to detect whether a number of the plurality of interferometric modulators of the panel are in a. stiction state, wherein with respect to an interferometric modulator that is in the stiction state, a first portion of the interferometric modulator adheres to a second portion of the interferometric modulator; and
a processor configured to communicate with the voltage source and the detector and identify a first voltage at which a first threshold number of the plurality of interferometric modulators of the panel enter the stiction state.

13. The apparatus of claim 12, wherein the detector is configured to optically detect the number of the interferometric modulators in the stiction state.

14. The apparatus of claim 12, wherein the detector is configured to calculate the number of the interferometric modulators in the stiction state by measuring a capacitance of the panel.

15. The apparatus of claim 12, wherein the detector comprises a camera configured to identify a number of the interferometric modulators that enter the stiction state by taking an image of the panel and analyzing the image.

16. The apparatus of claim 12, wherein the processor is additionally configured to compare the identified first voltage and an actuation threshold voltage of the panel.

17. The apparatus of claim 16, wherein the processor is additionally configured to compare a first parameter that is based at least in part upon the identified first voltage and one of the actuation threshold voltage and a voltage bias of the panel with a second parameter that is based at least in part upon an identified first voltage and one of an actuation threshold voltage and a voltage bias of another panel.

18. The apparatus of claim 12, wherein the processor is additionally configured to identify a second voltage at which a second threshold number of the plurality of interferometric modulators of the panel do not enter the stiction state; and
wherein the voltage source is additionally configured to terminate applying the voltage subsequent to the ramped voltage reaching the second voltage.

19. The apparatus of claim 12, wherein the voltage source applies the ramped voltage waveform starting at an offset voltage of the panel.

20. The apparatus of claim 19, wherein the ramped voltage waveform is charge-balanced.

21. The apparatus of claim 20, wherein the ramped voltage waveform comprises a first portion at which the plurality of interferometric modulators of the panel are in a released state, a second portion at which the plurality of interferometric modulators of the panel are in an actuated state, and a third portion at which the predetermined proportion of the plurality of interferometric modulators of the panel are in a stiction state.

22. The apparatus of claim 12, wherein the panel is one of a plurality of panels that constitute a plate.

23. An apparatus for testing a panel comprising a plurality of interferometric modulators, comprising:
means for applying a ramped voltage waveform to the plurality of interferometric modulators of the panel; and
means for, in response to applying the ramped voltage, identifying a first voltage at which a first threshold number of the plurality of interferometric modulators of the panel enter a stiction state, wherein with respect to an interferometric modulator that enters the stiction state, a first portion of the interferometric modulator adheres to a second portion of the interferometric modulator.

24. The apparatus of claim 23, wherein the means for identifying the first voltage comprises means for optically detecting a number of the interferometric modulators that enter the stiction state.

25. The apparatus of claim 23, wherein the means for identifying the first voltage comprises means for identifying a number of the interferometric modulators that enter the stiction state by taking an image of the panel and analyzing the image.

26. A non-transitory computer-readable medium having stored thereon instructions, comprising:
instructions that, when executed by a computer, cause the computer to apply a ramped voltage waveform to a plurality of interferometric modulators of a panel; and
instructions that, when executed by the computer, cause the computer to in response to applying the ramped voltage, identify a first voltage at which a first threshold number of the plurality of interferometric modulators of the panel enter a stiction state, wherein with respect to an interferometric modulator that enters the stiction state, a first portion of the interferometric modulator adheres to a second portion of the interferometric modulator.

27. The computer-readable medium of claim 26, further comprising instructions that cause the computer to optically detect a number of the interferometric modulators that enter the stiction state.

28. The computer-readable medium of claim 26, further comprising instructions that cause the computer to calculate a number of the interferometric modulators that enter the stiction state by measuring a capacitance of the panel.

29. The computer-readable medium of claim 26, further comprising instructions that cause the computer to identify a number of the interferometric modulators that enter the stiction state by taking an image of the panel and analyzing the image.

30. The computer-readable medium of claim 26, further comprising instructions that cause the computer to compare the identified first voltage and an actuation threshold voltage of the panel.

31. The computer-readable medium of claim 30, further comprising instructions that cause the computer to compare a first parameter that is based at least in part upon the identified first voltage and one of the actuation threshold voltage and a voltage bias of the panel with a second parameter that is based at least in part upon an identified first voltage and one of an actuation threshold voltage and a voltage bias of another panel.

32. The computer-readable medium of claim 26, further comprising instructions that cause the computer to:
   identify a second voltage at which a second threshold number of the plurality of interferometric modulators of the panel do not enter the stiction state; and
   terminate applying the voltage subsequent to the ramped voltage reaching the second voltage.

* * * * *

UNITED STATES PATENT AND TRADEMARK OFFICE
CERTIFICATE OF CORRECTION

| | | |
|---|---|---|
| PATENT NO. | : 8,027,800 B2 | Page 1 of 1 |
| APPLICATION NO. | : 12/145407 | |
| DATED | : September 27, 2011 | |
| INVENTOR(S) | : Ramez Nachman et al. | |

It is certified that error appears in the above-identified patent and that said Letters Patent is hereby corrected as shown below:

At Column 19, Line 56, in Claim 12, change "a." to --a--.

Signed and Sealed this
Twenty-fourth Day of April, 2012

David J. Kappos
*Director of the United States Patent and Trademark Office*